United States Patent
Ohnishi et al.

(10) Patent No.: US 10,869,390 B2
(45) Date of Patent: Dec. 15, 2020

(54) RESIN COMPOSITION, PREPREG, METAL FOIL-CLAD LAMINATE, AND PRINTED CIRCUIT BOARD

(71) Applicant: MITSUBISHI GAS CHEMICAL COMPANY, INC., Tokyo (JP)

(72) Inventors: Nobuyoshi Ohnishi, Tokyo (JP); Yoichi Takano, Tokyo (JP); Tomo Chiba, Tokyo (JP); Meguru Ito, Tokyo (JP); Eisuke Shiga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 189 days.

(21) Appl. No.: 15/736,541

(22) PCT Filed: Jul. 4, 2016

(86) PCT No.: PCT/JP2016/069741
§ 371 (c)(1),
(2) Date: Dec. 14, 2017

(87) PCT Pub. No.: WO2017/006889
PCT Pub. Date: Jan. 12, 2017

(65) Prior Publication Data
US 2018/0199435 A1 Jul. 12, 2018

(30) Foreign Application Priority Data
Jul. 6, 2015 (JP) .................. 2015-135204

(51) Int. Cl.
| | | |
|---|---|---|
| H05K 1/03 | (2006.01) |
| B32B 15/08 | (2006.01) |
| C08F 22/40 | (2006.01) |
| C08F 220/18 | (2006.01) |
| C08F 220/46 | (2006.01) |
| C08G 81/02 | (2006.01) |
| C08J 5/24 | (2006.01) |
| C08K 3/22 | (2006.01) |
| C08K 3/36 | (2006.01) |
| C08L 101/00 | (2006.01) |
| C08L 33/04 | (2006.01) |
| C08L 33/24 | (2006.01) |
| C08L 63/00 | (2006.01) |

(52) U.S. Cl.
CPC .......... H05K 1/0373 (2013.01); B32B 15/08 (2013.01); C08F 22/40 (2013.01); C08F 220/18 (2013.01); C08F 220/46 (2013.01); C08G 81/021 (2013.01); C08J 5/24 (2013.01); C08K 3/22 (2013.01); C08K 3/36 (2013.01); C08L 33/04 (2013.01); C08L 101/00 (2013.01); *C08F 2800/20* (2013.01); *C08J 2300/24* (2013.01); *C08J 2333/12* (2013.01); *C08K 2003/2227* (2013.01); C08L 33/24 (2013.01); C08L 63/00 (2013.01)

(58) Field of Classification Search
None
See application file for complete search history.

(56) References Cited

U.S. PATENT DOCUMENTS

| | | | |
|---|---|---|---|
| 2009/0017316 A1 | 1/2009 | Kato et al. | |
| 2011/0084409 A1 | 4/2011 | Sugino et al. | |
| 2011/0194261 A1 | 8/2011 | Tanaka et al. | |
| 2012/0018072 A1 | 1/2012 | Ueno et al. | |
| 2014/0367883 A1* | 12/2014 | Hatakeyama | C09K 5/14 264/175 |
| 2015/0037589 A1 | 2/2015 | Inoue et al. | |
| 2015/0075852 A1 | 3/2015 | Inoue et al. | |
| 2015/0267047 A1 | 9/2015 | Takahashi et al. | |
| 2016/0017141 A1* | 1/2016 | Matsumoto | C08J 5/24 428/418 |
| 2016/0309582 A1* | 10/2016 | Tomizawa | B32B 15/08 |
| 2019/0150279 A1* | 5/2019 | Obata | B32B 5/28 174/258 |

FOREIGN PATENT DOCUMENTS

| | | |
|---|---|---|
| CN | 102057484 A | 5/2011 |
| CN | 104736588 A | 6/2015 |
| EP | 2254147 A1 | 11/2010 |
| JP | 3173332 B | 3/2001 |
| JP | 2009-035728 A | 2/2009 |
| JP | 2010-126642 A | 6/2010 |
| JP | 2011-178992 A | 9/2011 |
| JP | 2012197336 A * | 10/2012 |

(Continued)

OTHER PUBLICATIONS

Fujiwara et al., Machine translation of JP2012197336A, Oct. 18, 2012. (Year: 2012).*
International Search Report issued with respect to Application PCT/JP2016/069741, dated Sep. 27, 2016.
International Preliminary Report on Patentability issued with respect to Application PCT/JP2016/069741, dated Jan. 9, 2018.

*Primary Examiner* — Ramsey Zacharia

(74) *Attorney, Agent, or Firm* — Greenblum & Bernstein, P.L.C.

(57) ABSTRACT

A resin composition comprising a thermosetting resin, a functional group-modified copolymer, and an inorganic filler, wherein the functional group-modified copolymer has two or more alkyl (meth)acrylate units, or one or two or more alkyl (meth)acrylate units and an acrylonitrile unit, and at least a part of alkyl ester groups of the alkyl (meth) acrylate units and/or a cyano group of the acrylonitrile unit are/is modified with at least one selected from the group consisting of an epoxy group, a carboxyl group, and an amide group.

12 Claims, No Drawings

(56) References Cited

FOREIGN PATENT DOCUMENTS

| | | |
|---|---|---|
| JP | 2013-001807 A | 1/2013 |
| JP | 2013-127022 A | 6/2013 |
| JP | 2013-216884 A | 10/2013 |
| JP | 2015-013941 A | 1/2015 |
| JP | 2015-044969 A | 3/2015 |
| JP | 2015-048472 A | 3/2015 |
| JP | 2015-082535 A | 4/2015 |
| WO | 2010/109861 A | 9/2010 |
| WO | WO-2015105109 A1 * | 7/2015 |

* cited by examiner

RESIN COMPOSITION, PREPREG, METAL FOIL-CLAD LAMINATE, AND PRINTED CIRCUIT BOARD

TECHNICAL FIELD

The present invention relates to a resin composition, a prepreg, a metal foil-clad laminate, and a printed circuit board.

BACKGROUND ART

In accordance with functionality increase and downsizing of semiconductor packages widely used in electronic devices, communication devices, personal computers and the like, high integration and high-density packaging of each component for semiconductor packages have been increasingly accelerated in recent years. As a result, a difference in the coefficient of thermal expansion between a semiconductor device and a printed circuit board for a semiconductor plastic package disadvantageously causes warp of the semiconductor plastic package, and there have been various countermeasures against this problem.

One of the countermeasures is reduction of the thermal expansion of an insulating layer for use in a printed circuit board. In this countermeasure, the warp is suppressed by setting the coefficient of thermal expansion of a printed circuit board to be close to the coefficient of thermal expansion of a semiconductor device, and this method is now actively employed (see, for example, Patent Literatures 1 to 3).

In addition to the reduction of the thermal expansion of a printed circuit board, as a method for suppressing the warp of a semiconductor plastic package, increase of rigidity (rigidity increase) of a laminate and increase of a glass transition temperature (Tg increase) of a laminate are now being examined (see, for example, Patent Literatures 4 and 5).

CITATION LIST

Patent Literature

Patent Literature 1: Japanese Patent Laid-Open No. 2013-216884
Patent Literature 2: Japanese Patent No. 3173332
Patent Literature 3: Japanese Patent Laid-Open No. 2009-035728
Patent Literature 4: Japanese Patent Laid-Open No. 2013-001807
Patent Literature 5: Japanese Patent Laid-Open No. 2011-178992

SUMMARY OF INVENTION

Technical Problem

The reduction of the thermal expansion of a printed circuit board by the conventional methods described in Patent Literatures 1 to 3 have, however, already reached their limits, and it is difficult to further reduce the thermal expansion by these methods.

The rigidity increase of a laminate is attained by highly incorporating a filler in a resin composition to be used for the laminate, or by using an inorganic filler having a high elastic modulus such as alumina. However, the high incorporation of a filler degrades moldability of the laminate, and the use of an inorganic filler such as alumina degrades the coefficient of thermal expansion of the laminate. Accordingly, the warp of a semiconductor plastic package cannot be sufficiently suppressed by the rigidity increase of a laminate.

Besides, the method by the Tg increase of a laminate improves an elastic modulus in reflow, and hence is effective for reduction of the warp of a semiconductor plastic package. The method by the Tg increase causes, however, degradation of heat resistance after moisture absorption due to increased crosslink density or occurrence of a void resulting from the moldability degradation, and therefore, this method occasionally causes a practical problem in the field of electronic materials where very high reliability is required. That is to say, there is not a resin composition that satisfies low thermal expansion as well as copper foil peel strength and moldability, and there is a demand for an approach that solves these problems.

The present invention has been made in light of the problems described above, and an object of the present invention is to provide a resin composition that can provide a cured product which has a low coefficient of thermal expansion and a high copper foil peel strength and which has excellent moldability, and to provide a prepreg, a metal foil-clad laminate, and a printed circuit board in which the resin composition is used.

Solution to Problem

The present inventors have conducted diligent studies to attain the object and, as a result, found that the use of a predetermined functional group-modified copolymer makes it possible to solve the problem. On the basis of this finding, the present invention has been completed.

That is to say, the present invention is as set forth below.

[1]
A resin composition comprising:
a thermosetting resin,
a functional group-modified copolymer, and
an inorganic filler, wherein
the functional group-modified copolymer has two or more alkyl (meth)acrylate units, or one or two or more alkyl (meth)acrylate units and an acrylonitrile unit, and at least a part of alkyl ester groups of the alkyl (meth)acrylate units and/or a cyano group of the acrylonitrile unit are/is modified with at least one selected from the group consisting of an epoxy group, a carboxyl group, and an amide group.

[2]
The resin composition according to [1], wherein the thermosetting resin comprises at least one selected from the group consisting of a maleimide compound, a cyanic acid ester compound, a phenol resin, an alkenyl-substituted nadimide, and an epoxy resin.

[3]
The resin composition according to [2], wherein the alkenyl-substituted nadimide comprises a compound represented by formula (1):

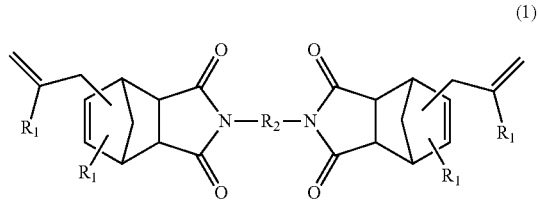

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by formula (2) or (3):

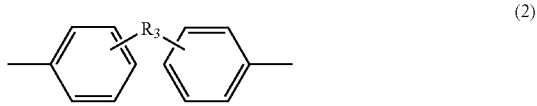

(2)

wherein $R_3$ represents a methylene group, an isopropylidene group, or a substituent represented by —CO—, —O—, —S—, or $SO_2$, and

(3)

wherein each $R_4$ independently represents an alkylene group having 1 to 4 carbon atoms, a cycloalkylene group having 5 to 8 carbon atoms, or —$SO_2$—.

[4]

The resin composition according to [2] or [3], wherein the alkenyl-substituted nadimide comprises a compound represented by formula (4) and/or (5):

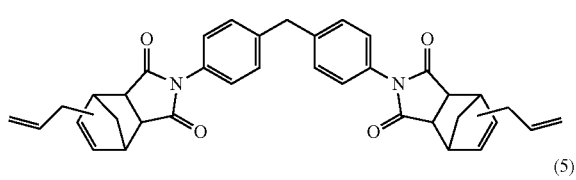

(4)

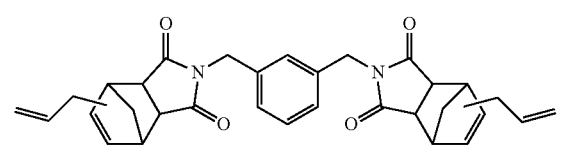

(5)

[5]

The resin composition according to any one of [2] to [4], wherein the maleimide compound comprises at least one selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by formula (6):

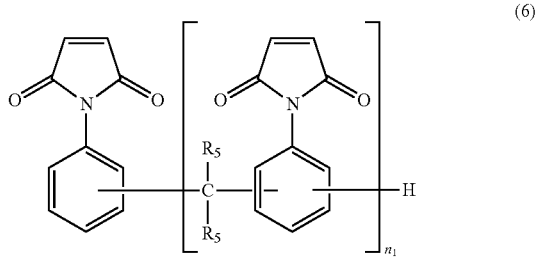

(6)

wherein each $R_5$ independently represents a hydrogen atom or a methyl group, and $n_1$ represents an integer of 1 or larger.

[6]

The resin composition according to any one of [2] to [5], wherein the cyanic acid ester compound comprises a compound represented by formula (7) and/or (8):

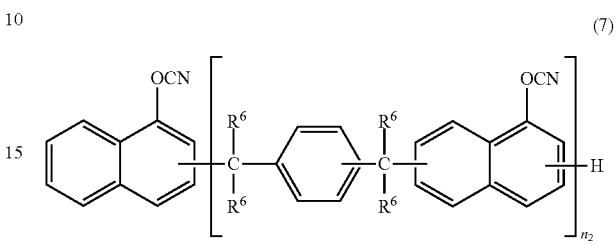

(7)

wherein each $R^6$ independently represents a hydrogen atom or a methyl group, and $n_2$ represents an integer of 1 or larger, and

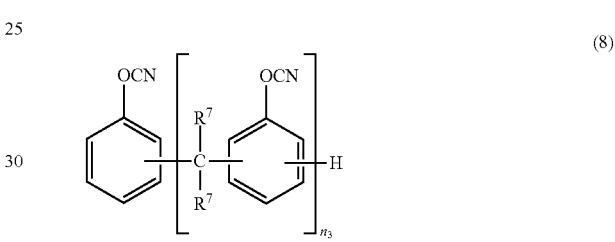

(8)

wherein each $R^7$ independently represents a hydrogen atom or a methyl group, and $n_3$ represents an integer of 1 or larger.

[7]

The resin composition according to any one of [2] to [6], wherein the epoxy resin has an epoxy equivalent of 50 to 500 g/eq.

[8]

The resin composition according to any one of [1] to [7], wherein the inorganic filler comprises boehmite and/or silica.

[9]

The resin composition according to any one of [1] to [8], wherein a content of the thermosetting resin is 30 to 95% by mass based on a total mass of resin components in the resin composition.

[10]

The resin composition according to any one of [1] to [9], wherein a content of the functional group-modified copolymer is 0.5 to 50% by mass based on a total mass of resin components in the resin composition.

[11]

The resin composition according to any one of [1] to [10], wherein a content of the inorganic filler is 40 to 80% by mass based on a total mass of the resin composition.

[12]

A prepreg comprising:
a base material, and
a resin composition according to any one of [1] to [11], wherein
the base material is impregnated or coated with the resin composition.

[13]

The prepreg according to [12], wherein the base material is at least one selected from the group consisting of E glass cloth, T glass cloth, S glass cloth, Q glass cloth, and an organic fiber.

[14]

A resin sheet comprising:
a sheet base material, and
a resin composition according to any one of [1] to [11], wherein
the resin composition is laminated on one side or both sides of the sheet base material.

[15]

A metal foil-clad laminate comprising:
a metal foil, and
at least one selected from the group consisting of a prepreg according to [12] and [13] and a resin sheet according to [14], which are disposed on the metal foil.

[16]

A printed circuit board comprising:
an insulating layer, and
a conductor layer formed on a surface of the insulating layer, wherein
the insulating layer comprises a resin composition according to any one of [1] to [11].

Advantageous Effects of Invention

The present invention can provide a resin composition that can provide a cured product which has a low coefficient of thermal expansion and a high copper foil peel strength and which has excellent moldability, and can provide a prepreg, a metal foil-clad laminate, and a printed circuit board in which the resin composition is used.

DESCRIPTION OF EMBODIMENTS

Hereinafter, the mode for carrying out the present invention (hereinafter, referred to as the "present embodiment") will be described in detail. However, the present invention is not intended to be limited by the present embodiment, and various changes or modifications can be made therein without departing from the spirit of the present invention.

[Resin Composition]

The resin composition of the present embodiment comprises a thermosetting resin, a functional group-modified copolymer, and an inorganic filler, wherein the functional group-modified copolymer has two or more alkyl (meth)acrylate units, or one or two or more alkyl (meth)acrylate units and an acrylonitrile unit, and at least a part of the alkyl ester groups of the alkyl (meth)acrylate units and/or the cyano group of the acrylonitrile unit are/is modified with at least one selected from the group consisting of an epoxy group, a carboxyl group, and an amide group.

Normally, an attempt to reduce the coefficient of thermal expansion is problematic in that the glass transition temperature is also lowered accordingly. In contrast, since a functional group-modified copolymer is used in the resin composition of the present embodiment, both a reduction in the coefficient of thermal expansion and an improvement in the glass transition temperature can be achieved. Further, due to an epoxy group or the like, the adhesion between a cured product of the resin composition and a copper foil is improved and, as a result, the copper foil peel strength can be improved. Hereinafter, each component will be described.

[Thermosetting Resin]

The thermosetting resin is not particularly limited, and examples thereof include a combination comprising a maleimide compound, a cyanic acid ester compound, and an epoxy resin (a first embodiment); a combination comprising a maleimide compound, a phenol resin, and an epoxy resin (a second embodiment); a combination comprising a maleimide compound, an alkenyl-substituted nadimide, and an epoxy resin (a third embodiment); a combination comprising a maleimide compound, an alkenyl-substituted nadimide, and a cyanic acid ester compound (a fourth embodiment); a combination comprising a maleimide compound, an alkenyl-substituted nadimide, a cyanic acid ester compound, and an epoxy resin (a fifth embodiment); and a combination comprising a maleimide compound and an alkenyl-substituted nadimide (a sixth embodiment). Hereinafter, each embodiment will be described.

First Embodiment

In the first embodiment, the resin composition comprises a thermosetting resin comprising a maleimide compound, a cyanic acid ester compound, and an epoxy resin. When such a thermosetting resin is used, heat resistance, water absorbability, insulating properties, copper foil peel strength tend to be further improved.

(Maleimide Compound)

The maleimide compound is not particularly limited as long as the compound has one or more maleimide groups in the molecule, and examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the formula (6), prepolymers of these maleimide compounds, and prepolymers of maleimide compounds and amine compounds. In particular, at least one selected from the group consisting of bis(4-maleimidophenyl)methane, 2,2-bis{4-(4-maleimidophenoxy)-phenyl}propane, bis(3-ethyl-5-methyl-4-maleimidophenyl)methane, and a maleimide compound represented by the formula (6) are preferred. When such a maleimide compound is contained, the resulting cured product tends to have a further lowered coefficient of thermal expansion and a further improved heat resistance. The maleimide compound may be used singly or in combinations of two or more thereof.

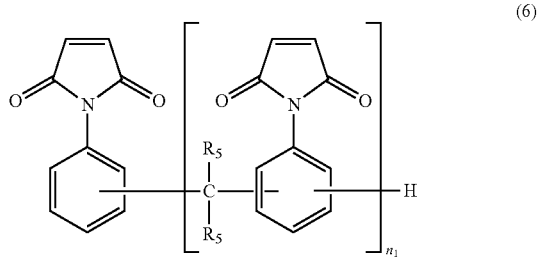

(6)

In this formula, each $R_5$ independently represents a hydrogen atom or a methyl group, and $n_1$ represents an integer of 1 or larger.

In the formula (6), $R_5$ represents a hydrogen atom or a methyl group, and preferably represents a hydrogen atom.

In the formula (6), $n_1$ represents an integer of 1 or larger. $n_1$ is preferably 10 or less, more preferably 7 or less.

In the first embodiment, the content of the maleimide compound is preferably 5 to 35% by mass, more preferably 10 to 30% by mass, further preferably 15 to 25% by mass, based on the total mass of the resin components in the resin composition (not including the inorganic filler; the same holds true for the description below). When the content of the maleimide compound falls within the range described above, heat resistance and curability tend to be further improved.

(Cyanic Acid Ester Compound)

The cyanic acid ester compound is not particularly limited, and examples thereof include naphthol aralkyl-based cyanic acids ester represented by the formula (7), novolac-based cyanic acid esters represented by the formula (8), biphenyl aralkyl-based cyanic acid esters, bis(3,5-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2'-bis(4-cyanatophenyl)propane; and prepolymers of these cyanic acid esters. The cyanic acid ester compound is used singly or in combinations of two or more thereof.

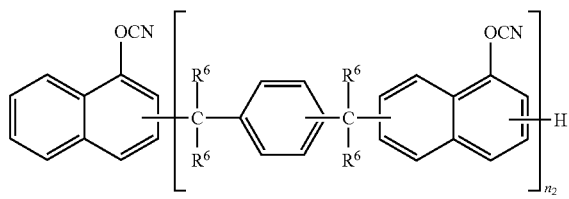

(7)

In the formula (7), each $R^6$ independently represents a hydrogen atom or a methyl group and, in particular, a hydrogen atom is preferred. In the formula (7), $n_2$ represents an integer of 1 or larger. The upper limit of $n_2$ is usually 10, preferably 6.

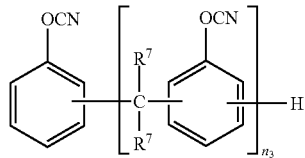

(8)

In the formula (8), each $R^7$ independently represents a hydrogen atom or a methyl group and, in particular, a hydrogen atom is preferred. In the formula (8), $n_3$ represents an integer of 1 or larger. The upper limit of $n_3$ is usually 10, preferably 7.

In particular, the cyanic acid ester compound preferably comprises one or more selected from the group consisting of naphthol aralkyl-based cyanic acid esters represented by the formula (7), novolac-based cyanic acid esters represented by the formula (8), and biphenyl aralkyl-based cyanic acid esters, and more preferably comprises one or more selected from the group consisting of naphthol aralkyl-based cyanic acid esters represented by the formula (7) and novolac-based cyanic acid esters represented by the formula (8). When such a cyanic acid ester compound is used, a cured product tends to be obtained, which has a better flame retardancy, higher curabilty, and lower coefficient of thermal expansion.

Methods for producing these cyanic acid ester compounds are not particularly limited, and methods known as cyanic acid ester compound synthesis methods can be used. The known methods are not particularly limited, and examples thereof include a method involving reacting a phenol resin and a cyanogen halide in an inert organic solvent in the presence of a basic compound, and a method involving forming a salt of a phenol resin and a basic compound in a water-containing solution and then subjecting the resulting salt and a cyanogen halide to a biphasic interface reaction.

The phenol resin serving as a raw material of these cyanic acid ester compounds is not particularly limited, and examples thereof include naphthol aralkyl-based phenol resins represented by the formula (9), novolac-based phenol resins, and biphenyl aralkyl-based phenol resins.

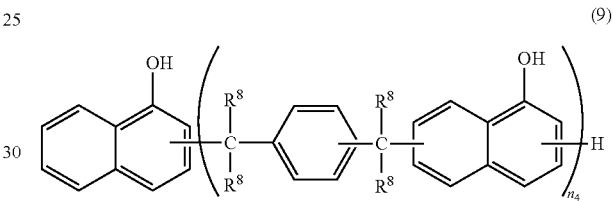

(9)

In the formula (9), each $R^8$ independently represents a hydrogen atom or a methyl group and, in particular, a hydrogen atom is preferred. In the formula (9), $n_4$ represents an integer of 1 or larger. The upper limit of $n_4$ is usually 10, preferably 6.

The naphthol aralkyl-based phenol resin represented by the formula (9) can be obtained by condensing a naphthol aralkyl resin and cyanic acid. Here, the naphthol aralkyl-based phenol resin is not particularly limited, and examples thereof include those obtained by reacting naphthols such as α-naphthol and β-naphthol with benzenes such as p-xylylene glycol, α,α'-dimethoxy-p-xylene, and 1,4-di(2-hydroxy-2-propyl)benzene. The naphthol aralkyl-based cyanic acid ester can be selected from those obtained by condensing naphthol aralkyl resins obtained as described above and cyanic acid.

In the first embodiment, the content of the cyanic acid ester compound is preferably 10 to 45% by mass, more preferably 15 to 45% by mass, further preferably 20 to 35% by mass, based on the total mass of the resin components in the resin composition. When the content of the cyanic acid ester compound falls within the range described above, heat resistance and chemical resistance tend to be further improved.

(Epoxy Resin)

The epoxy resin is not particularly limited as long as it is a compound having two or more epoxy groups in one molecule, and examples thereof include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, cresol novolac-based epoxy resins, biphenyl-based epoxy resins, naphthalene-based epoxy resins, trifunctional phenol-based epoxy resins, tetrafunctional phenol-based epoxy resins, glycidyl ester-based epoxy resins, phenol aralkyl-based epoxy resins, biphenyl aralkyl-based epoxy resins, aralkyl novolak-based epoxy resins, naphthol aralkyl-based epoxy resins, dicyclopentadiene-based epoxy resins, polyol-based epoxy resins, isocyanurate ring-containing epoxy resins, and halides thereof. The epoxy resin may be used singly or in combinations of two or more thereof.

The epoxy equivalent of the epoxy resin in the resin composition is not particularly limited, and is preferably 50 to 500 g/eq., more preferably 150 to 350 g/eq., in view of heat resistance. When the epoxy group equivalent of the epoxy resin falls within the range described above, heat resistance and curability tend to be further improved.

In the first embodiment, the content of the epoxy resin is preferably 10 to 45% by mass, more preferably 15 to 35% by mass, further preferably 20 to 30% by mass, based on the total mass of the resin components in the resin composition. When the content of the epoxy resin falls within the range described above, heat resistance and curability tend to be further improved.

In the first embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

Second Embodiment

In the second embodiment, the resin composition comprises a thermosetting resin comprising a maleimide compound, a phenol resin, and an epoxy resin. When such a thermosetting resin is used, heat resistance and chemical resistance tend to be further improved.

The maleimide compound and the epoxy resin in the second embodiment are as those in the first embodiment.

In the second embodiment, the content of the maleimide compound is preferably 5 to 35% by mass, more preferably 10 to 30% by mass, further preferably 15 to 25% by mass, based on the total mass of the resin components in the resin composition. When the content of the maleimide compound falls within the range described above, heat resistance and curability tend to be further improved.

In the second embodiment, the content of the epoxy resin is preferably 10 to 45% by mass, more preferably 15 to 45% by mass, further preferably 20 to 40% by mass, based on the total mass of the resin components in the resin composition. When the content of the epoxy resin falls within the range described above, heat resistance and curability tend to be further improved.

(Phenol Resin)

A known phenol resin can be suitably used, and the type thereof is not particularly limited. Examples thereof include resins having two or more phenolic hydroxy groups in one molecule. The phenol resin is not particularly limited, and examples thereof include cresol novolak-based phenol resins, phenol novolak resins, alkyl phenol novolac resins, bisphenol A-based novolac resins, dicyclopentadiene-based phenol resins, xylok-based phenol resins, terpene-modified phenol resins, polyvinyl phenols, naphthol aralkyl-based phenol resins represented by the formula (10), biphenyl aralkyl-based phenol resins represented by the formula (11), naphthalene-based phenol resins, and aminotriazine novolac-based phenol resins. The phenol resin may be used singly or in combinations of two or more thereof.

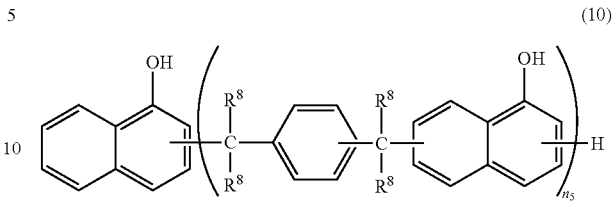

(10)

In the formula (10), each $R^8$ independently represents a hydrogen atom or a methyl group and, in particular, a hydrogen atom is preferred. In the formula (10), $n_5$ represents an integer of 1 or larger. The upper limit of $n_5$ is usually 10, preferably 6.

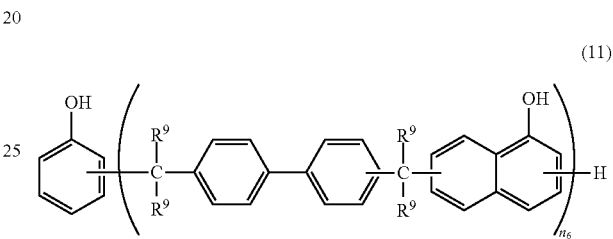

(11)

In the formula (11), each R9 independently represents a hydrogen atom or a methyl group and, in particular, represents a hydrogen atom. In the formula (11), $n_6$ represents an integer of 1 or larger. The upper limit of $n_6$ is usually 10, preferably 7.

In particular, the phenol resin preferably comprises one or more selected from the group consisting of cresol novolak-based phenol resins, aminotriazine novolac-based phenol resins, naphthalene-based phenol resins, naphthol aralkyl-based phenol resins represented by the formula (10), and biphenyl aralkyl-based phenol resins represented by the formula (11), more preferably comprises one or more selected from the group consisting of cresol novolak-based phenol resins, naphthol aralkyl-based phenol resins represented by the formula (10), and biphenyl aralkyl-based phenol resins represented by the formula (11), and further preferably comprises one or more selected from the group consisting of naphthol aralkyl-based phenol resins represented by the formula (10) and biphenyl aralkyl-based phenol resins represented by the formula (11). When such a phenol resin is used, the resulting cured product tends to have a further lowered water absorbability and a further improved heat resistance.

The hydroxy group equivalent of the phenol resin in the resin composition is not particularly limited, and is preferably 50 to 500 g/eq., more preferably 100 to 350 g/eq., in view of heat resistance.

In the second embodiment, the content of the phenol resin is preferably 10 to 45% by mass, more preferably 15 to 40% by mass, further preferably 30 to 35% by mass, based on the total mass of the resin components in the resin composition. When the content of the phenol resin falls within the range described above, heat resistance and chemical resistance tend to be further improved.

In the second embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

Third Embodiment

In the third embodiment, the resin composition comprises a thermosetting resin comprising a maleimide compound, an alkenyl-substituted nadimide, and an epoxy resin. When such a thermosetting resin is used, heat resistance tends to be further improved.

The maleimide compound and the epoxy resin in the third embodiment are as those in the first embodiment.

In the third embodiment, the content of the maleimide compound is preferably 30 to 80% by mass, more preferably 35 to 70% by mass, further preferably 40 to 60% by mass, based on the total mass of the resin components in the resin composition. When the content of the maleimide compound falls within the range described above, heat resistance and chemical resistance tend to be further improved.

In the third embodiment, the content of the epoxy resin is preferably 0.5 to 30% by mass, more preferably 1.0 to 20% by mass, further preferably 2 to 10% by mass, based on the total mass of the resin components in the resin composition. When the content of the epoxy resin falls within the range described above, heat resistance and curability tend to be further improved.

(Alkenyl-Substituted Nadimide Compound)

The alkenyl-substituted nadimide compound is not particularly limited as long as the compound has one or more alkenyl-substituted nadimide groups in the molecule. In particular, compounds represented by the formula (1) are preferred. When such an alkenyl-substituted nadimide compound is used, the resulting cured product tends to have a further lowered coefficient of thermal expansion and a further improved heat resistance.

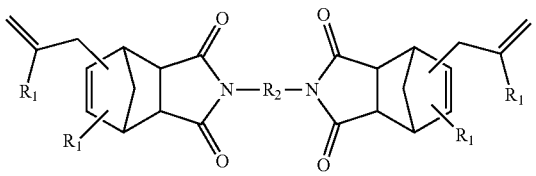
(1)

In the formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the formula (2) or (3)

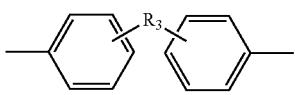
(2)

wherein $R_3$ represents a methylene group, an isopropylidene group, or a substituent represented by CO, O, S, or $SO_2$, and

(3)

wherein each $R_4$ independently represents an alkylene group having 1 to 4 carbon atoms, or a cycloalkylene group having 5 to 8 carbon atoms.

Among the compounds represented by the formula (1), the alkenyl-substituted nadimide compounds are preferably compounds represented by the formula (4) and/or (5). When such an alkenyl-substituted nadimide compound is used, the resulting cured product tends to have a further lowered coefficient of thermal expansion and a further improved heat resistance.

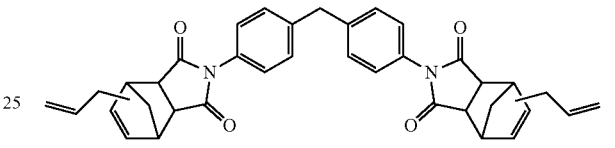
(4)

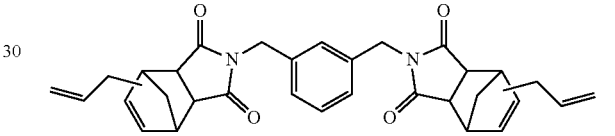
(5)

In addition, a commercially available product can also be used as the alkenyl-substituted nadimide compound. Examples of the commercially available product include, but are not particularly limited to, BANI-M (manufactured by Maruzen Petrochemical Co., Ltd., a compound represented by the formula (4)), and BANI-X (manufactured by Maruzen Petrochemical Co., Ltd., a compound represented by the formula (5)). These compounds may be used singly or in combinations of two or more thereof.

In the third embodiment, the content of the alkenyl-substituted nadimide is preferably 10 to 60% by mass, more preferably 15 to 50% by mass, further preferably 20 to 40% by mass, based on the total mass of the resin components in the resin composition. When the content of the alkenyl-substituted nadimide falls within the range described above, heat resistance tends to be further improved.

In the third embodiment, the ratio between the number of alkenyl groups (A) of the alkenyl-substituted nadimide and the number of maleimide groups (B) of the maleimide compound ([B/A]) is preferably 0.9 to 4.3, more preferably 1.5 to 4.0, further preferably 1.5 to 3.0. When the ratio ([B/A]) falls within the range described above, heat resistance, chemical resistance, and the elastic modulus retention tend to be further improved.

In the third embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

Fourth Embodiment

In the fourth embodiment, the resin composition comprises a thermosetting resin comprising a maleimide compound, an alkenyl-substituted nadimide, and a cyanic acid ester compound. When such a thermosetting resin is used, heat resistance tends to be further improved.

The maleimide compound and the cyanic acid ester compound in the fourth embodiment are as those in the first embodiment. Also, the alkenyl-substituted nadimide in the fourth embodiment is as those in the third embodiment.

In the fourth embodiment, the content of the maleimide compound is preferably 30 to 80% by mass, more preferably 35 to 70% by mass, further preferably 40 to 60% by mass, based on the total mass of the resin components in the resin composition. When the content of the maleimide compound falls within the range described above, heat resistance and curability tend to be further improved.

In the fourth embodiment, the content of the cyanic acid ester compound is preferably 0.5 to 30% by mass, more preferably 1 to 20% by mass, further preferably 2 to 10% by mass, based on the total mass of the resin components in the resin composition. When the content of the cyanic acid ester compound falls within the range described above, heat resistance and chemical resistance tend to be further improved.

In the fourth embodiment, the content of the alkenyl-substituted nadimide is preferably 10 to 60% by mass, more preferably 15 to 50% by mass, further preferably 20 to 40% by mass, based on the total mass of the resin components in the resin composition. When the content of the alkenyl-substituted nadimide falls within the range described above, heat resistance tends to be further improved.

In the fourth embodiment, the ratio between the number of alkenyl groups (A) of the alkenyl-substituted nadimide and the number of maleimide groups (B) of the maleimide compound ([B/A]) is preferably 0.9 to 4.3, more preferably 1.5 to 4.0, further preferably 1.5 to 3.0. When the ratio ([B/A]) falls within the range described above, heat resistance, chemical resistance, and the elastic modulus retention tend to be further improved.

In the fourth embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

Fifth Embodiment

In the fifth embodiment, the resin composition comprises a thermosetting resin comprising a maleimide compound, an alkenyl-substituted nadimide, a cyanic acid ester compound, and an epoxy resin. When such a thermosetting resin is used, heat resistance tends to be further improved.

The maleimide compound, the cyanic acid ester compound, and the epoxy resin in the fifth embodiment are as those in the first embodiment. Also, the alkenyl-substituted nadimide in the fifth embodiment is as those in the third embodiment.

In the fifth embodiment, the content of the maleimide compound is preferably 30 to 80% by mass, more preferably 35 to 70% by mass, further preferably 40 to 60% by mass, based on the total mass of the resin components in the resin composition. When the content of the maleimide compound falls within the range described above, heat resistance and curability tend to be further improved.

In the fifth embodiment, the content of the cyanic acid ester compound is preferably 0.5 to 30% by mass, more preferably 1 to 20% by mass, further preferably 2 to 10% by mass, based on the total mass of the resin components in the resin composition. When the content of the cyanic acid ester compound falls within the range described above, heat resistance and chemical resistance tend to be further improved.

In the fifth embodiment, the content of the epoxy resin is preferably 0.5 to 30% by mass, more preferably 1.0 to 20% by mass, further preferably 2 to 10% by mass, based on the total mass of the resin components in the resin composition. When the content of the epoxy resin falls within the range described above, heat resistance and curability tend to be further improved.

In the fifth embodiment, the content of the alkenyl-substituted nadimide is preferably 10 to 60% by mass, more preferably 15 to 50% by mass, further preferably 20 to 40% by mass, based on the total mass of the resin components in the resin composition. When the content of the alkenyl-substituted nadimide falls within the range described above, heat resistance tends to be further improved.

In the fifth embodiment, the ratio between the number of alkenyl groups (A) of the alkenyl-substituted nadimide and the number of maleimide groups (B) of the maleimide compound ([B/A]) is preferably 0.9 to 4.3, more preferably 1.5 to 4.0, further preferably 1.5 to 3.0. When the ratio ([B/A]) falls within the range described above, heat resistance, chemical resistance, and the elastic modulus retention tend to be further improved.

In the fifth embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

Sixth Embodiment

In the sixth embodiment, the resin composition comprises a thermosetting resin comprising a maleimide compound and an alkenyl-substituted nadimide. When such a thermosetting resin is used, heat resistance and the elastic modulus retention tend to be further improved.

The maleimide compound in the sixth embodiment is as those in the first embodiment. Also, the alkenyl-substituted nadimide in the sixth embodiment is as those in the third embodiment.

In the sixth embodiment, the content of the maleimide compound is preferably 30 to 80% by mass, more preferably 35 to 70% by mass, further preferably 40 to 60% by mass, based on the total mass of the resin components in the resin composition. When the content of the maleimide compound falls within the range described above, heat resistance and curability tend to be further improved.

In the sixth embodiment, the content of the alkenyl-substituted nadimide is preferably 10 to 60% by mass, more preferably 15 to 50% by mass, further preferably 20 to 40% by mass, based on the total mass of the resin components in the resin composition. When the content of the alkenyl-substituted nadimide falls within the range described above, heat resistance tends to be further improved.

In the sixth embodiment, the ratio between the number of alkenyl groups (A) of the alkenyl-substituted nadimide and the number of maleimide groups (B) of the maleimide compound ([B/A]) is preferably 0.9 to 4.3, more preferably 1.5 to 4.0, further preferably 1.5 to 3.0. When the ratio ([B/A]) falls within the range described above, heat resistance, chemical resistance, and the elastic modulus retention tend to be further improved.

In the sixth embodiment, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

As a summary of each embodiment described above, generally, the content of the thermosetting resin is preferably 30 to 95% by mass, more preferably 40 to 90% by mass, further preferably 50 to 85% by mass, based on the total mass of the resin components in the resin composition. When the content of the thermosetting resin falls within the range described above, heat resistance, chemical resistance, and copper foil peel strength tend to be further improved.

[Functional group-modified copolymer]

The functional group-modified copolymer has two or more alkyl (meth)acrylate units, or one or two or more alkyl (meth)acrylate units and an acrylonitrile unit, and at least some of the alkyl ester groups of the alkyl (meth)acrylate units and/or the cyano group of the acrylonitrile unit are/is modified with at least one selected from the group consisting of an epoxy group, a carboxyl group, and an amide group. That is to say, the functional group-modified copolymer has an epoxy group, a carboxyl group, or an amide group on its side chain. In particular, in terms of chemical resistance and copper foil peel strength, the functional group-modified copolymer preferably has an epoxy group and an amide group on its side chain.

The alkyl (meth)acrylate unit is not particularly limited, and examples thereof include a methyl (meth)acrylate unit, an ethyl (meth)acrylate unit, a propyl (meth)acrylate unit, an isopropyl (meth)acrylate unit, a butyl (meth)acrylate unit, an isobutyl (meth)acrylate unit, and a tertiary butyl (meth)acrylate unit. In particular, an ethyl (meth)acrylate unit, a butyl (meth)acrylate unit, an isobutyl (meth)acrylate unit, and a tertiary butyl (meth)acrylate unit are preferred. The term "two or more alkyl (meth)acrylate units" means two or more alkyl (meth)acrylate units having different alkyl groups.

The viscosity of the functional group-modified copolymer at 20° C. (methyl ethyl ketone, solid content 15% by mass) is preferably 500 to 7500 mPa·s, more preferably 750 to 6500 mPa·s, further preferably 1000 to 6000 mPa·s. When the viscosity of the functional group-modified copolymer at 20° C. falls within the range described above, copper foil peel strength, moldability, and low thermal expansion tend to be further improved. The viscosity of the functional group-modified copolymer at 20° C. can be measured with a rotational viscometer.

The weight-average molecular weight (Mw) of the functional group-modified copolymer is preferably 100000 to 1500000, more preferably from 250000 to 1000000, and further preferably 350000 to 850000. When the weight-average molecular weight of the functional group-modified copolymer falls within the range described above, copper foil peel strength, moldability, and low thermal expansion tend to be further improved. The weight-average molecular weight can be measured by GPC technique using standard polystyrene.

The glass transition temperature of the functional group-modified copolymer is preferably −10 to 45° C., more preferably 0 to 25° C., further preferably 7.5 to 15° C. When the glass transition temperature of the functional group-modified copolymer is within the range described above, the resulting cured product tends to have a further lowered coefficient of thermal expansion and a further improved copper foil peel strength. The glass transition temperature can be measured by DSC.

The acid value of the functional group-modified copolymer is preferably 1 mg KOH/kg to 100 mg KOH/kg, more preferably 5 mg KOH/kg to 80 mg KOH/kg, further preferably 15 mg KOH/kg to 70 mg KOH/kg. When the acid value of the functional group-modified copolymer falls within the range described above, the resulting cured product tends to have a further lowered coefficient of thermal expansion and a further improved copper foil peel strength.

When the functional group-modified copolymer comprises an epoxy group, the epoxy equivalent of the functional group-modified copolymer is preferably 0.001 eq/kg to 1.0 eq/kg, more preferably 0.002 eq/kg to 0.8 eq/kg, further preferably 0.01 eq/kg to 0.5 eq/kg. When the epoxy equivalent of the functional group-modified copolymer falls within the range described above, the resulting cured product tends to have a further lowered coefficient of thermal expansion and a further improved copper foil peel strength.

When the functional group-modified copolymer comprises an amide group, the amide group equivalent of the functional group-modified copolymer is preferably 0.002 eq/kg to 8.1 eq/kg, more preferably 0.006 eq/kg to 4.1 eq/kg, further preferably 0.009 eq/kg to 2.7 eq/kg. When the amide group equivalent of the functional group-modified copolymer falls within the range described above, copper foil peel strength tends to be further improved.

The content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product tends to have a further lowered coefficient of thermal expansion and a high copper foil peel strength.

Especially, when the thermosetting resin of the first embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

When the thermosetting resin of the second embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

When the thermosetting resin of the third embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

When the thermosetting resin of the fourth embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

When the thermosetting resin of the fifth embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

When the thermosetting resin of the sixth embodiment is used, the content of the functional group-modified copolymer is preferably 0.5 to 50% by mass, more preferably 1.0 to 40% by mass, further preferably 5 to 30% by mass, based on the total mass of the resin components in the resin composition. When the content of the functional group-modified copolymer falls within the range described above, the resulting cured product has a further lowered coefficient of thermal expansion and a high copper foil peel strength.

[Inorganic Filler]

The inorganic filler is not particularly limited, and examples thereof include silica such as natural silica, fused silica, synthetic silica, amorphous silica, Aerosil, and hollow silica; silicon compounds such as white carbon; metal oxides such as titanium white, zinc oxide, magnesium oxide, and zirconium oxide; metal nitrides such as boron nitride, aggregated boron nitride, silicon nitride, and aluminum nitride; metal sulfates such as barium sulfate; metal hydroxides such as aluminum hydroxide, a heat-treated aluminum hydroxide (which is obtained by heat-treating aluminum hydroxide and partially removing crystallization water), boehmite, and magnesium hydroxide; molybdenum compounds such as molybdenum oxide and zinc molybdate; zinc compounds such as zinc borate and zinc stannate; and alumina, clay, kaolin, talc, baked clay, baked kaolin, baked talc, mica, E glass, A glass, NE glass, C glass, L glass, D glass, S glass, M glass G20, short glass fiber (including fine glass powders such as E glass, T glass, D glass, S glass, and Q glass), hollow glass, and spherical glass. The inorganic filler may be used singly or in combinations of two or more thereof.

In particular, boehmite and/or silica is preferably contained. When such an inorganic filler is used, the coefficient of thermal expansion tends to be further lowered.

The content of the inorganic filler is not particularly limited, and is preferably 40 to 80% by mass, more preferably 50 to 75% by mass, further preferably 60 to 70% by mass, based on the total mass of the resin composition (including the inorganic filler). When the content of the inorganic filler falls within the range described above, the coefficient of thermal expansion tends to be further lowered.

[Silane Coupling Agent and Wetting Dispersant]

The resin composition of the present embodiment may further comprise a silane coupling agent and a wetting dispersant. When a silane coupling agent and a wetting dispersant are contained, the dispersibility of the filler and the adhesion strength of the resin components, the filler, and the base material, which will be described below, tend to be further improved.

The silane coupling agent is not particularly limited as long as it is a silane coupling agent generally used in the surface treatment of inorganic matter, and examples thereof include aminosilane compounds such as γ-aminopropyltriethoxysilane and N-β-(aminoethyl)-γ-aminopropyltrimethoxysilane; epoxysilane compounds such as γ-glycidoxypropyltrimethoxysilane; acrylsilane compounds such as γ-acryloxypropyltrimethoxysilane; cationic silane compounds such as N-β-(N-vinylbenzylaminoethyl)-γ-aminopropyltrimethoxysilane hydrochloride; and phenylsilane compounds. The silane coupling agent may be used singly or in combinations of two or more thereof.

The wetting dispersant is not particularly limited as long as it is a dispersion stabilizer used in paints, and examples thereof include DISPER-110, 111, 118, 180, 161, BYK-W996, W9010, and W903 manufactured by BYK Japan K.K.

[Curing Accelerator]

The resin composition of the present embodiment may further comprise a curing accelerator. The curing accelerator is not particularly limited, and examples thereof include organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylaniline-ethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide.

[Solvent]

The resin composition of the present embodiment may further comprise a solvent. When a solvent is contained, there is a tendency that viscosity during the preparation of the resin composition is reduced, thus handleability is further improved, and the impregnation of a base material, which will be described below, is further improved.

The solvent is not particularly limited as long as the solvent is capable of dissolving a portion or the whole of the resin components in the resin composition, and examples thereof include ketones such as acetone, methyl ethyl ketone, and methylcellosolve; aromatic hydrocarbons such as toluene and xylene; amides such as dimethylformamide; and propylene glycol monomethyl ether and its acetate. The solvent may be used singly or in combinations of two or more thereof.

[Method for Producing Resin Composition]

The method for producing the resin composition of the present embodiment is not particularly limited, and examples thereof include a method involving sequentially adding each component to a solvent and sufficiently stirring the mixture. At this time, for uniformly dissolving or dispersing each component, treatment such as stirring, mixing, or kneading treatment known in the art can be carried out. Specifically, by stirring and dispersion treatment using a stirring vessel equipped with a stirrer having an appropriate stirring ability, the dispersibility of the inorganic filler in the resin composition can be enhanced. The stirring, mixing, or kneading treatment can be appropriately carried out using an apparatus known in the art such as an apparatus aimed at mixing, for example, a ball mill or a bead mill, or a revolution- or rotation-type mixing apparatus.

Also, an organic solvent can be used, if necessary, during the preparation of the resin composition. The type of the organic solvent is not particularly limited as long as the solvent is capable of dissolving the resins in the resin composition. Specific examples thereof are as listed above.

[Applications]

The resin composition can be suitably used as a prepreg, an insulating layer, a metal foil-clad laminate, a resin sheet, or a printed circuit board. Hereinafter, the prepreg, the resin sheet, the metal foil-clad laminate, or the printed circuit board will be described.

[Prepreg]

The prepreg of the present embodiment comprises a base material and the resin composition, wherein the base material is impregnated or coated with the resin composition. The method for producing the prepreg can be carried out according to a routine method without particular limitations. For example, the base material can be impregnated or coated with the resin components according to the present embodiment, followed by semi-curing (conversion to B-stage) by heating or the like for 1 to 30 minutes in a drier of 100 to 200° C. to prepare the prepreg of the present embodiment.

The content of the resin composition (containing the inorganic filler) is preferably 30 to 90% by mass, more preferably 35 to 85% by mass, preferably 40 to 80% by mass, based on the total mass of the prepreg. When the content of the resin composition falls within the range described above, moldability tends to be further improved.

(Base Material)

The base material is not particularly limited and can be appropriately selected for use from various printed circuit board materials known in the art according to the intended use or performance. Specific examples of the fiber constituting the base material include, but are not particularly limited to, glass fibers such as E glass, D glass, S glass, Q glass, spherical glass, NE glass, L glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.) and Zexion® (manufactured by KB Seiren, Ltd.); and organic fibers such as poly-p-phenylene benzoxazole (Zylon®, manufactured by Toyobo Co., Ltd.) and polyimide. Among them, at least one selected from the group consisting of E glass cloth, T glass cloth, S glass cloth, Q glass cloth, and an organic fiber is preferred in view of a low coefficient of thermal expansion. These base materials may be used singly or in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the base material of approximately 0.01 to 0.3 mm is preferably used. In particular, the base material is preferably a glass woven fabric having a thickness of 200 µm or smaller and a mass of 250 g/m² or smaller, more preferably a glass woven fabric made of a glass fiber of E glass, S glass, and T glass in view of strength and water absorbability.

[Resin Sheet]

The resin sheet of the present embodiment comprises a sheet base material and the resin composition laminated on one side or both sides of the sheet base material. The resin sheet is used as an approach for thinning and can be produced, for example, by directly coating a support such as a metal foil or a film with a thermosetting resin (containing an inorganic filler) for use in prepregs, etc., followed by drying.

The sheet base material is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

Examples of the coating method include a method of applying a solution of the resin composition of the present embodiment dissolved in a solvent onto the sheet base material using a bar coater, a die coater, a doctor blade, a Baker applicator, or the like.

The resin sheet is preferably a product obtained by coating the sheet base material with the resin composition, followed by semi-curing (conversion to B-stage). Specific examples thereof include a method which involves coating the sheet base material such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 µm in terms of the resin thickness of the resin sheet.

[Metal Foil-Clad Laminate]

The metal foil-clad laminate of the present embodiment comprises an insulating layer and a conductor layer formed by lamination on one side or both sides of the insulating layer, wherein the insulating layer is composed of the prepreg, the resin sheet, or the resin composition. That is to say, the metal foil-clad laminate of the present embodiment can be obtained by laminating and curing a metal foil and at least one selected from the group consisting of the prepreg and the resin sheet.

The insulating layer may be composed of the resin composition, one layer of the prepreg, or the resin sheet, or may be a laminate of two or more layers of the resin composition, the prepreg, or the resin sheet.

The conductor layer can be a metal foil of copper, aluminum, or the like. In this context, the metal foil used is not particularly limited as long as the metal foil can be used as a printed circuit board material. A copper foil known in the art such as a rolled copper foil or an electrolytic copper foil is preferred. The thickness of the conductor layer is not particularly limited and is preferably 1 to 70 µm, more preferably 1.5 to 35 µm.

The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C. Alternatively, the prepreg mentioned above may be lamination-molded in combination with a separately prepared wiring board for an inner layer to obtain a multilayer board.

[Printed Circuit Board]

The printed circuit board of the present embodiment is a printed circuit board comprising an insulating layer and a conductor layer formed on the surface of the insulating layer, wherein the insulating layer comprises the resin composition mentioned above. The metal foil-clad laminate mentioned above can be suitably used as the printed circuit board by forming a predetermined circuit pattern. The metal foil-clad laminate has a low coefficient of thermal expansion as well as good moldability and chemical resistance, and can be particularly effectively used as a printed circuit board for semiconductor packages required to have such performance.

Specifically, the printed circuit board of the present embodiment can be produced by, for example, the method below. First, the metal foil-clad laminate (copper-clad laminate, etc.) mentioned above is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of layers of the prepreg mentioned above are laminated on the resulting inner layer circuit surface. Further, a metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

For example, the prepreg mentioned above (base material impregnated with the resin composition mentioned above) or the resin composition layer of the metal foil-clad laminate (layer composed of the resin composition mentioned above) constitutes the insulating layer comprising the resin composition mentioned above.

When the metal foil-clad laminate is not used, the printed circuit board may be prepared by forming the conductor layer that serves as a circuit on the prepreg, the resin sheet, or the resin composition. In this case, an electroless plating approach may be used for forming the conductor layer.

The printed circuit board of the present embodiment can be particularly effectively used as a printed circuit board for semiconductor packages, because the insulating layer mentioned above maintains the excellent elastic modulus even at a reflow temperature during semiconductor packaging and thereby effectively suppresses the warp of semiconductor plastic packages.

EXAMPLES

Hereinafter, the present invention will be described in more detail by way of Examples and Comparative Examples. The present invention is not limited by the following Examples in any way.

Synthesis Example 1

In the reactor, 0.47 mol (in terms of OH group) of an α-naphthol aralkyl resin (SN495V, OH group equivalent: 236 g/eq., manufactured by Nippon Steel & Sumikin Chemical Co., Ltd.: including those with the number n of naphthol aralkyl repeating units being 1 to 5) was dissolved in 500 ml of chloroform, and 0.7 mol of triethylamine was added to this solution. While maintaining the temperature at −10° C., 300 g of a chloroform solution of 0.93 mol of cyanogen chloride was added dropwise over 1.5 hours, and after the completion of the dropwise addition, the mixture was stirred for 30 minutes. Thereafter, a mixed solution of 0.1 mol of triethylamine and 30 g of chloroform was further added dropwise to the reactor, and the mixture was stirred for 30 minutes to complete the reaction. The by-product triethylamine hydrochloride was filtered off from the reaction solution, and the resulting filtrate was washed with 500 ml of 0.1 N hydrochloric acid and then washed with 500 ml of water 4 times. This was dried over sodium sulfate, evaporated at 75° C. and, further, degassed under reduced pressure at 90° C. Thereby, an α-naphthol aralkyl-based cyanic acid ester resin (SNCN) was obtained as a brown solid. An infrared absorption spectrum analysis of the resulting α-naphthol aralkyl-based cyanic acid ester resin verified an absorption of a cyanic acid ester group in the vicinity of 2264 cm$^{-1}$.

Example 1

24 parts by mass of the α-naphthol aralkyl-based cyanic acid ester resin (SNCN) obtained in Synthesis Example 1, 19 parts by mass of a maleimide compound (BMI-2300, manufactured by Daiwa Fine Chemicals Co., Ltd.), 27 parts by mass of a naphthalene skeleton-modified polyfunctional epoxy resin (HP-6000, epoxy equivalent: 250 g/eq., manufactured by DIC Corporation), 30 parts by mass of an epoxy-modified copolymer (SG-P3, epoxy equivalent 0.21 eq/kg (4.76 g/eq.), weight-average molecular weight (Mw) 850000, manufactured by Nagase ChemteX Corporation) as a functional group-modified copolymer, 200 parts by mass of spherical silica (SC5050, manufactured by Admatechs Co., Ltd.), 2.5 parts by mass of a silane coupling agent (KMB-403, manufactured by Shin-Etsu Chemical Co., Ltd.), and 1 part by mass of a wetting dispersant (disperbyk-161, manufactured by BYK Japan K.K.) were mixed, and the mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass.

Example 2

Varnish was obtained in the same manner as in Example 1 except that 30 parts by mass of an epoxy-amide-modified copolymer (SG-80H, epoxy equivalent 0.07 eq/kg (14.3 g/eq.), weight-average molecular weight (Mw) 350000, manufactured by Nagase ChemteX Corporation) was used as a functional group-modified copolymer in place of 30 parts by mass of an epoxy-modified copolymer (SG-P3, epoxy equivalent 4.76 g/eq., weight-average molecular weight (Mw) 850000, manufactured by Nagase ChemteX Corporation). An E glass woven fabric was impregnated and coated with this varnish, and dried by heating at 160° C. for 3 minutes to obtain a prepreg having a resin composition content of 46% by mass.

Comparative Example 1

Varnish was obtained in the same manner as in Example 1 except that 30 parts by mass of an acrylic copolymer (LA-2330, manufactured by Kuraray Co., Ltd.), which was a thermoplastic elastomer, was used as a functional group-modified copolymer in place of 30 parts by mass of an epoxy-modified copolymer (SG-P3, epoxy equivalent 4.76 g/eq., weight-average molecular weight (Mw) 850000, manufactured by Nagase ChemteX Corporation). An E glass woven fabric was impregnated and coated with this varnish, and dried by heating at 160° C. for 3 minutes to obtain a prepreg having a resin composition content of 46% by mass.

Comparative Example 2

5 parts by mass of the α-naphthol aralkyl-based cyanic acid ester resin (SNCN), 42 parts by mass of a maleimide compound (BMI-2300, manufactured by Daiwa Fine Chemicals Co., Ltd.), 33 parts by mass of alkenyl-substituted nadimide (BANI-M, manufactured by Maruzen Petrochemical Co., Ltd.), 20 parts by mass of an acrylic copolymer (LA-2330, manufactured by Kuraray Co., Ltd.) as a thermoplastic elastomer, 200 parts by mass of spherical silica (SC5050, manufactured by Admatechs Co., Ltd.), 2.5 parts by mass of a silane coupling agent (KMB-403, manufactured by Shin-Etsu Chemical Co., Ltd.), and 1 part by mass of a wetting dispersant (disperbyk-161, manufactured by BYK Japan K.K.) were mixed to obtain varnish. An E glass woven fabric was impregnated and coated with this varnish, and dried by heating at 160° C. for 3 minutes to obtain a prepreg having a resin composition content of 46% by mass.

Example 3

5 parts by mass of the α-naphthol aralkyl-based cyanic acid ester resin (SNCN), 42 parts by mass of a maleimide compound (BMI-2300, manufactured by Daiwa Fine Chemicals Co., Ltd.), 33 parts by mass of alkenyl-substituted nadimide (BANI-M, manufactured by Maruzen Petrochemical Co., Ltd.), 20 parts by mass of an epoxy-modified copolymer (SG-P3, epoxy equivalent 4.76 g/eq., weight-average molecular weight (Mw) 850000, manufactured by Nagase ChemteX Corporation) as a functional group-modified copolymer, 200 parts by mass of spherical silica (SC5050, manufactured by Admatechs Co., Ltd.), 2.5 parts by mass of a silane coupling agent (KMB-403, manufactured by Shin-Etsu Chemical Co., Ltd.), and 1 part by mass of a wetting dispersant (disperbyk-161, manufactured by BYK Japan K.K.) were mixed to obtain varnish. An E glass woven fabric was impregnated and coated with this varnish, and dried by heating at 160° C. for 3 minutes to obtain a prepreg having a resin composition content of 46% by mass.

Example 4

3 parts by mass of the α-naphthol aralkyl-based cyanic acid ester resin (SNCN), 40 parts by mass of a maleimide compound (BMI-2300, manufactured by Daiwa Fine Chemicals Co., Ltd.), 30 parts by mass of alkenyl-substituted nadimide (BANI-M, manufactured by Maruzen Petrochemical Co., Ltd.), 7 parts by mass of biphenyl aralkyl-based epoxy resin (NC-3000H, epoxy equivalent: 290 g/eq., manufactured by Nippon Kayaku Co., Ltd.), 20 parts by mass of an epoxy-modified copolymer (SG-P3, epoxy equivalent 4.76 g/eq., weight-average molecular weight (Mw) 850000, manufactured by Nagase ChemteX Corporation) as a functional group-modified copolymer, 200 parts by mass of spherical silica (SC5050, manufactured by Admatechs Co., Ltd.), 2.5 parts by mass of a silane coupling agent (KMB-403, manufactured by Shin-Etsu Chemical Co., Ltd.), and 1 part by mass of a wetting dispersant (disperbyk-161, manufactured by BYK Japan K.K.) were mixed to obtain varnish. An E glass woven fabric was impregnated and coated with this varnish, and dried by heating at 160° C. for 3 minutes to obtain a prepreg having a resin composition content of 46% by mass.

[Moldability: Moldable Thickness]

An electrolytic copper foil having a thickness of 12 μm (3EC-III, manufactured by Mitsui Mining & Smelting Co., Ltd.) was disposed on the upper and lower sides of the prepregs obtained in Examples and Comparative Examples, followed by lamination molding at a pressure of 30 kgf/cm² at a temperature of 220° C. for 120 minutes to obtain metal foil-clad laminates. At this time, one layer or two or more layers of the prepregs were used to obtain a plurality of metal foil-clad laminates having different thicknesses between 90 to 120 μm in increments of 1 μm. The resulting metal foil-clad laminates were cut in the cross-sectional direction, and their surfaces were observed under a microscope. This procedure was repeated to determine the minimum thickness at which voids (space resulting from molding defects) were not produced in the surfaces.

[Moldability: Length of Streak from End]

An electrolytic copper foil having a thickness of 12 μm (3EC-III, manufactured by Mitsui Mining & Smelting Co., Ltd.) was disposed on the upper and lower sides of the prepregs obtained in Examples and Comparative Examples, followed by lamination molding at a pressure of 30 kgf/cm² at a temperature of 220° C. for 120 minutes to obtain metal foil-clad laminates. At this time, one layer or two or more layers of the prepregs were used to obtain metal foil-clad laminates having a thickness of 100 μm. The longest distance of the resin flowed from the end of the obtained base plate was measured.

[Preparation of Metal Foil-Clad Laminate]

An electrolytic copper foil having a thickness of 12 μm (3EC-III, manufactured by Mitsui Mining & Smelting Co., Ltd.) was disposed on the upper and lower sides of one layer or eight layers of the prepregs respectively obtained in Examples and Comparative Examples, followed by lamination molding at a pressure of 30 kgf/cm² at a temperature of 220° C. for 120 minutes to obtain metal foil-clad laminates having an insulating layer thickness of 0.1 mm or 0.8 mm.

[Elastic Modulus Retention]

In accordance with JIS Standard C 6481, the flexural modulus at 27° C. and 260° C. was measured to calculate the elastic modulus retention. Specifically, after the copper foils were removed from both sides of the above-obtained metal foil-clad laminate (50 mm×25 mm×0.8 mm) by etching, the flexural modulus was measured at 27° C. and 260° C. using an autograph (AG-Xplus manufactured by Shimadzu Corp.). The difference between the resulting flexural modulus at 27° C. (a) and flexural modulus under heat at 260° C. (b) was calculated according to the following formula:

Elastic modulus retention=[(b)/(a)]×100

[Coefficient of Thermal Expansion]

After the copper foils were removed from both sides of the above-obtained metal foil-clad laminates (4.5 mm×30 mm×0.1 mm) by etching, the temperature was raised from 40° C. to 340° C. at a rate of 10° C. per minute using a thermomechanical analyzer (manufactured by TA Instruments) to measure the coefficient of linear expansion in the plane direction at 60° C. to 120° C. The measurement direction was the longitudinal direction (Warp) of the glass cloth of the laminates.

[Copper Foil Peel Strength]

Using the above-obtained metal foil-clad laminates (30 mm×150 mm×0.8 mm), copper foil peel strength was measured in accordance with JIS C 6481.

at least a part of an alkyl ester group of the alkyl (meth)acrylate unit and/or a cyano group of the acrylonitrile unit are/is modified with at least one selected from the group consisting of an epoxy group, a carboxyl group, and an amide group, and the alkenyl-substituted nadimide comprises a compound represented by formula (1):

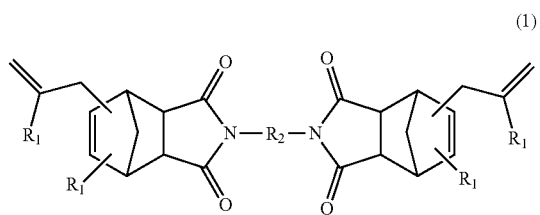

(1)

TABLE 1

|  |  | Comparative Example 1 | Example 1 | Example 2 | Comparative Example 2 | Example 3 | Example 4 |
|---|---|---|---|---|---|---|---|
| Moldability | Moldable thickness μm | 105< | 100< | 100< | 107< | 100< | 100< |
|  | End streak length mm | 50 | 10 | 5 | 15 | 5 | 5 |
| Elastic modulus retention DMA tension 0.1 t | Storage Modulus (27° C.-260° C.) | 82 | 82 | 82 | 88 | 88 | 88 |
| Coefficient of thermal expansion | (ppm/° C.) | 3.6 | 3.4 | 3.4 | 2.5 | 2.0 | 3.2 |
| Copper foil peel strength (20 μm) | kgf/cm 20 μm | 0.40 | 0.60 | 0.80 | 0.35 | 0.56 | 0.52 |

The present application is based on a Japanese patent application (Japanese Patent Application No. 2015-135204) filed with the Japan Patent Office on Jul. 6, 2015, the content of which is incorporated herein by reference.

INDUSTRIAL APPLICABILITY

The resin composition of the present embodiment has industrial applicability as a material of prepregs, metal foil-clad laminates, resin sheets, or printed circuit boards.

The invention claimed is:

1. A resin composition comprising:
a thermosetting resin consisting of:
  a maleimide compound, an alkenyl-substituted nadimide, and an epoxy resin;
  a maleimide compound, an alkenyl-substituted nadimide, and a cyanic acid ester compound;
  a maleimide compound, an alkenyl-substituted nadimide, a cyanic acid ester compound, and an epoxy resin; or
  a maleimide compound and an alkenyl-substituted nadimide;
a functional group-modified copolymer, and
an inorganic filler,
wherein:
the functional group-modified copolymer has two or more alkyl (meth)acrylate units, or one or two or more alkyl (meth)acrylate units and an acrylonitrile unit, wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by formula (2) or (3):

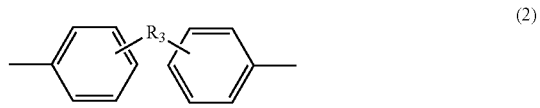

(2)

wherein $R_3$ represents a methylene group, an isopropylidene group, or a substituent represented by —CO—, —O—, —S—, or $SO_2$, and

(3)

wherein each $R_4$ independently represents an alkylene group having 1 to 4 carbon atoms, a cycloalkylene group having 5 to 8 carbon atoms, or —$SO_2$—.

2. The resin composition according to claim 1, wherein the alkenyl-substituted nadimide comprises a compound represented by formula (4) and/or (5):

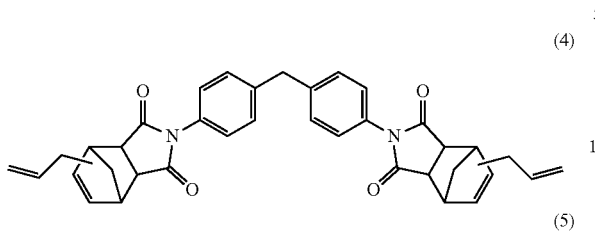

(4)

(5)

3. The resin composition according to claim 1, wherein the maleimide compound comprises at least one selected from the group consisting of bis(4-maleimidophenyl)methane, 2,2-bis {4-(4-maleimidophenoxy)-phenyl}propane, bis (3-ethyl-5-methyl-4-maleimidophenyl)methane, and a maleimide compound represented by formula (6):

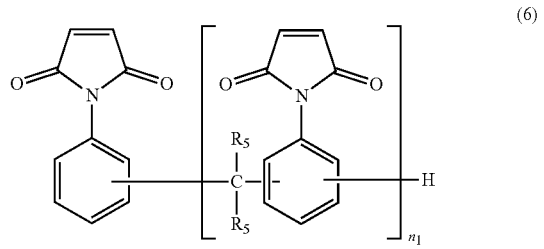

(6)

wherein each $R_5$ independently represents a hydrogen atom or a methyl group, and $n_1$ represents an integer of 1 or larger.

4. The resin composition according to claim 1, wherein the cyanic acid ester compound comprises a compound represented by formula (7) and/or (8):

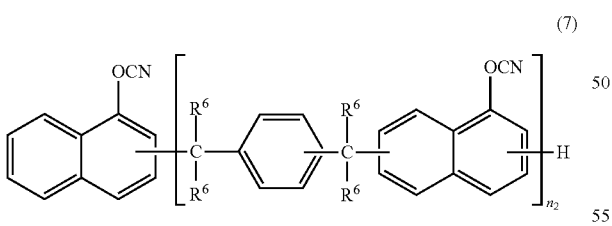

(7)

wherein each $R^6$ independently represents a hydrogen atom or a methyl group, and $n_2$ represents an integer of 1 or larger, and

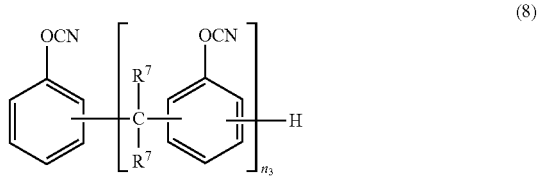

(8)

wherein each $R^7$ independently represents a hydrogen atom or a methyl group, and $n_3$ represents an integer of 1 or larger.

5. The resin composition according to claim 1, wherein the epoxy resin has an epoxy equivalent of 50 to 500 g/eq.

6. The resin composition according to claim 1 wherein the inorganic filler comprises boehmite and/or silica.

7. The resin composition according to claim 1, wherein a content of the thermosetting resin is 30 to 95% by mass based on a total mass of resin components in the resin composition.

8. The resin composition according to claim 1, wherein a content of the functional group-modified copolymer is 0.5 to 50% by mass based on a total mass of resin components in the resin composition.

9. The resin composition according to claim 1, wherein a content of the inorganic filler is 40 to 80% by mass based on a total mass of the resin composition.

10. A metal foil-clad laminate comprising:
a metal foil, and
at least one selected from the group consisting of a prepreg and a resin sheet disposed on the metal foil,
wherein the prepreg comprises a base material, and the resin composition according to claim 1, and the base material is impregnated or coated with the resin composition; and
the resin sheet comprises a sheet base material, and the resin composition according to claim 1, and the resin composition is laminated on one side or both sides of the sheet base material.

11. A printed circuit board comprising:
an insulating layer, and
a conductor layer formed on a surface of the insulating layer,
wherein the insulating layer comprises the resin composition according to claim 1.

12. The resin composition according to claim 1, wherein:
a content of the alkenyl-substituted nadimide is 20 to 50%,
a content of the maleimide is 30 to 70%, and
a content of the functional group-modified copolymer is 5 to 30%, by mass based on a total mass of resin components in the resin composition.

* * * * *